(12) United States Patent
Zhang et al.

(10) Patent No.: US 8,987,780 B2
(45) Date of Patent: Mar. 24, 2015

(54) GRAPHENE CAPPED HEMT DEVICE

(71) Applicant: STMicroelectronics, Inc., Coppell, TX (US)

(72) Inventors: John H Zhang, Fishkill, NY (US); Cindy Goldberg, Cold Spring, NY (US); Walter Kleemeier, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 4 days.

(21) Appl. No.: 13/907,752

(22) Filed: May 31, 2013

(65) Prior Publication Data

US 2014/0353722 A1    Dec. 4, 2014

(51) Int. Cl.
*H01L 29/66* (2006.01)
*H01L 29/778* (2006.01)

(52) U.S. Cl.
CPC ........ *H01L 29/66431* (2013.01); *H01L 29/778* (2013.01)
USPC ............... 257/183; 257/12; 257/51; 257/194; 257/E29.247

(58) Field of Classification Search
USPC ........................ 257/12, 51, 183, 194, E29.247
See application file for complete search history.

(56) References Cited

U.S. PATENT DOCUMENTS

2013/0193412 A1* 8/2013 Lee et al. ................... 257/29

OTHER PUBLICATIONS

Meric et al., "High-frequency performance of graphene field effect transistors with saturating IV-characteristics," Department of Electrical Engineering, Columbia University, IEEE International Electron Devices Meeting (IEDM), 2011, 4 pages.
Kobayashi et al., "Layered boron nitride as a release layer for mechanical transfer of GaN-based devices," Nature, vol. 484, Apr. 12, 2012, 5 pages.
"Graphene," Wikipedia, retrieved from URL=http://en.wikipedia.org/wiki/Graphen on May 31, 2013, 34 pages.
"High-electron-mobility transistor," Wikipedia, retrieved from URL=http://en.wikipedia.org/wiki/HEMT on May 31, 2013, 4 pages.

(Continued)

*Primary Examiner* — Tan N Tran
(74) *Attorney, Agent, or Firm* — Seed IP Law Group PLLC

(57) ABSTRACT

A graphene capped HEMT device and a method of fabricating same are disclosed. The graphene capped HEMT device includes one or more graphene caps that enhance device performance and/or reliability of an exemplary AlGaN/GaN heterostructure transistor used in high-frequency, high-energy applications, e.g., wireless telecommunications. The HEMT device disclosed makes use of the extraordinary material properties of graphene. One of the graphene caps acts as a heat sink underneath the transistor, while the other graphene cap stabilizes the source, drain, and gate regions of the transistor to prevent cracking during high-power operation. A process flow is disclosed for replacing a three-layer film stack, previously used to prevent cracking, with a one-atom thick layer of graphene, without otherwise degrading device performance. In addition, the HEMT device disclosed includes a hexagonal boron nitride adhesion layer to facilitate deposition of the compound nitride semiconductors onto the graphene.

10 Claims, 9 Drawing Sheets

(56) References Cited

OTHER PUBLICATIONS

"Fujitsu Develops World's First Gallium-Nitride HEMT for Power Supply," retrieved from URL=http://www.fujitsu.com/global/news/pr/archives/month/2009/20090624-01.html on May 31, 2013, 4 pages.

"High Electron Mobility Transistors (HEMT)," retrieved from URL=http://www.mwe.ee.ethz.ch/en/about-mwe-group/research/vision-and-aim/high-electron-mobility-transistors-hemt.html, 3 pages.

* cited by examiner

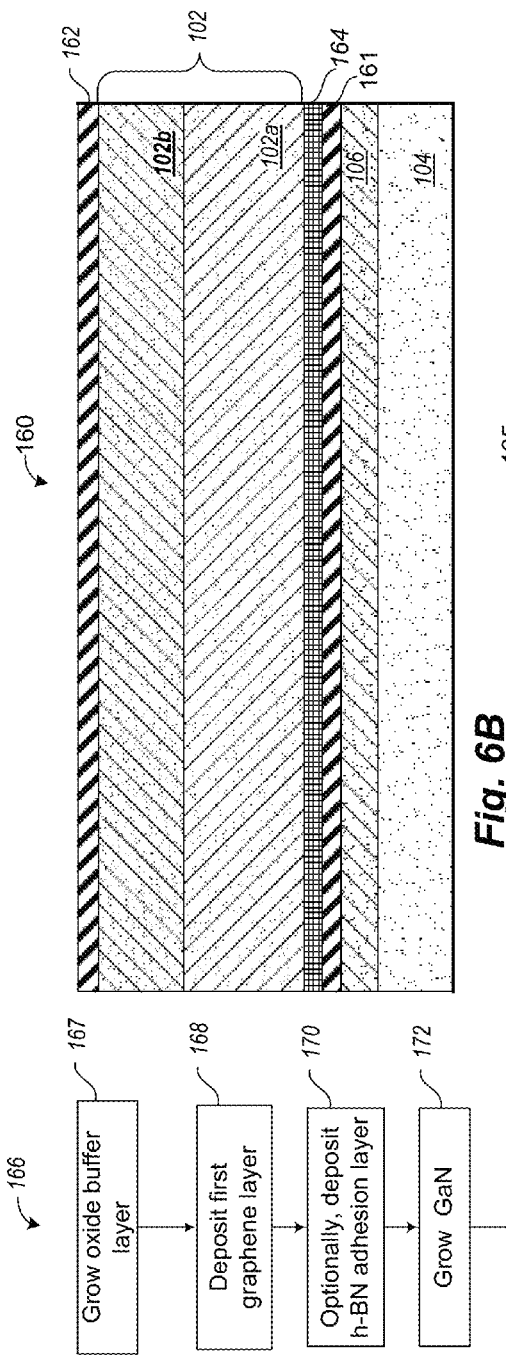
*Fig. 6B*
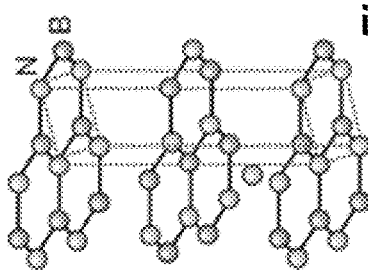
*Fig. 6C (Prior Art)*
*Fig. 6A*

GRAPHENE CAPPED HEMT DEVICE

BACKGROUND

1. Technical Field

The present disclosure relates to the fabrication of heterojunction transistors for high-frequency, high-power applications.

2. Description of the Related Art

A high electron mobility transistor (HEMT) is type of field effect transistor (FET) in which an electron current flows freely within a conduction channel in an un-doped semiconductor. Such a substantially unobstructed conduction channel forms adjacent to a heterojunction, i.e., a boundary between two different semiconductors. FIG. 1 shows an example of a conventional HEMT device 100 that includes a heterostructure 102 made of two different semiconductor materials, layers 102a and 102b ["High Electron Mobility Transistors," Laboratory for Millimeter Wave Electronics, Zurich, Switzerland (http://www.mwe.ee.ethz.ch/en/about-mwe-group/research/vision-and-aim/high-electron-mobility-transistors-hemt.html)]. The conventional HEMT device 100 can be built on any one of various different semiconductor substrates 104. A buffer layer 106 can be inserted between the substrate 104 and the heterostructure 102. Source and drain contacts 108 and 110, respectively, and a gate 112 are formed on the upper layer 102b of the heterostructure 102. The gate 112 modulates electron mobility within a conduction channel 114.

Formation of the conduction channel 114 at the heterojunction can be understood by considering energy levels within the heterostructure. A series of plots 116 to the right of the conventional HEMT device 100 show electron concentration 118 and energy levels 120 and 122 as a function of depth below a surface 124 of the heterostructure 102, along a spatial axis 126. The upper semiconductor in the heterostructure 102, layer 102b, is a negatively doped material having a wide energy band gap. The lower semiconductor in the heterostructure 102, layer 102a, is an un-doped material having a narrow energy band gap. [The term "band gap" refers to the difference between the energy of conduction band electrons (free electrons) and the energy of valence band electrons (atomically bound electrons) i.e., the amount of energy needed to liberate valence electrons from atoms in the semiconductor crystal.] Because the band gaps differ, the conduction band energies 120 and 122 of the materials do not coincide. Thus, when two such semiconductors are placed in contact with one another, their energy levels are discontinuous at the boundary. Such a discontinuity gives rise to a potential well 117 that develops at the boundary (heterojunction). The potential well 117 traps unbound donor electrons from the n-doped material at the surface of the un-doped material, resulting in a peak electron concentration 118 at the heterojunction. Such trapped donor electrons are sometimes referred to as a "two-dimensional electron gas." The location of the potential well 117 thus defines the conduction channel 114 of the HEMT. Source and drain regions at either end of the conduction channel 114 can be negatively doped or un-doped, depending on the device.

Because the conduction channel 114 lacks dopant impurities, electron mobility within the conduction channel 114 of a HEMT is high compared to the electron mobility in conventional FET devices. Such a high electron mobility allows a large electron current to flow within the conduction channel 114, thereby increasing the speed of the device. A voltage applied to the gate 112 alters the conductivity within the conduction channel 114, thereby modulating the electron current. The ability to support such a high electron current makes HEMT devices suitable for high-power, high-frequency applications such as chips used in RF communication devices (e.g., cell phones, satellite TV receivers, radar equipment, and the like). Furthermore, semiconductor materials typically used in HEMT devices include compound semiconductors that have high intrinsic electron mobility, such as, for example, gallium arsenide (GaAs), aluminum gallium arsenide (AlGaAs), gallium nitride (GaN), and indium gallium nitride (InGaN), among others. GaN HEMTs are known to perform particularly well in high-power applications.

Graphene has drawn attention in recent years as a material for use in FETs due to its extraordinary properties, as shown in FIGS. 2A and 2B. Graphene is a monolayer of carbon graphite atoms arranged in a honeycomb crystal lattice (FIG. 2A). Crystalline graphite is made of stacked sheets of graphene. Although graphene was known for many years, a single graphene sheet was not isolated until 2004, for which a Nobel prize in physics was awarded in 2010. Mechanically, graphene is one of the strongest materials ever tested, more than 100 times stronger than a comparable sheet of steel, (if steel could be made as thin as a graphene sheet). Graphene sheets are flexible and can be rolled into carbon nanotubes or formed into fullerene structures. Graphene is also very light weight, weighing only 0.77 mg per square meter.

Electrically, graphene has high electron mobility over a wide temperature range, lower resistance at room temperature than any known material, and low noise. Furthermore, a graphene film can be epitaxially grown on silicon carbide (SiC) by heating the SiC in a vacuum chamber to temperatures exceeding 1100C. The graphene film can then be patterned using conventional microelectronics techniques. Graphene has been studied as a material for use in microelectronics, such as in graphene field effect transistors (GFETs) [Meric, et al., Proceedings of the IEEE IEDM Conference, Dec. 5-7, 2011, pp. 2.1.1-2.1.4]. In a GFET, a graphene layer is used as the conducting channel to increase electron mobility for high-frequency applications. A GFET thus provides an alternative way to achieve a high electron mobility transistor without the use of a heterostructure.

BRIEF SUMMARY

A graphene capped HEMT device and a method of fabricating same are disclosed. The graphene capped HEMT device includes one or more graphene films that enhance device performance and/or reliability of an exemplary AlGaN/GaN heterostructure transistor used in high-frequency, high-energy applications. Such applications include, in particular, wireless telecommunications.

HEMT devices generally are advantageous because the conduction channel of the transistor resides within an un-doped material. In an un-doped material, electron mobility is enhanced because electrons experience fewer collisions. Higher electron mobility generally results in a faster device that switches on and off at high speed. Hence, such a device is useful for high-frequency signal processing.

The HEMT device disclosed makes use of the extraordinary material properties of graphene. One of the graphene films acts as a heat sink underneath the transistor, while the other stabilizes the source, drain, and gate regions of the transistor to prevent cracking and improve reliability during high-power operation. It is shown that a one-atom thick layer of graphene can replace a three-layer film stack previously used to prevent cracking, without otherwise degrading device performance. In addition, the HEMT device disclosed includes one or more hexagonal boron nitride adhesion layers to facilitate deposition of the compound nitride semiconductors onto the graphene films.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 6A is a process flow diagram showing a detailed sequence of processing steps that can be used to form a film stack for the graphene-capped HEMT as described herein, according to an exemplary embodiment.

FIG. 6B is a cross-sectional view of the film stack formed by the processing steps shown in FIG. 6A.

FIG. 6C is a pictorial view of molecular structure of a hexagonal boron nitride (h-BN) crystalline film, according to the prior art.

DETAILED DESCRIPTION

Figure 1:
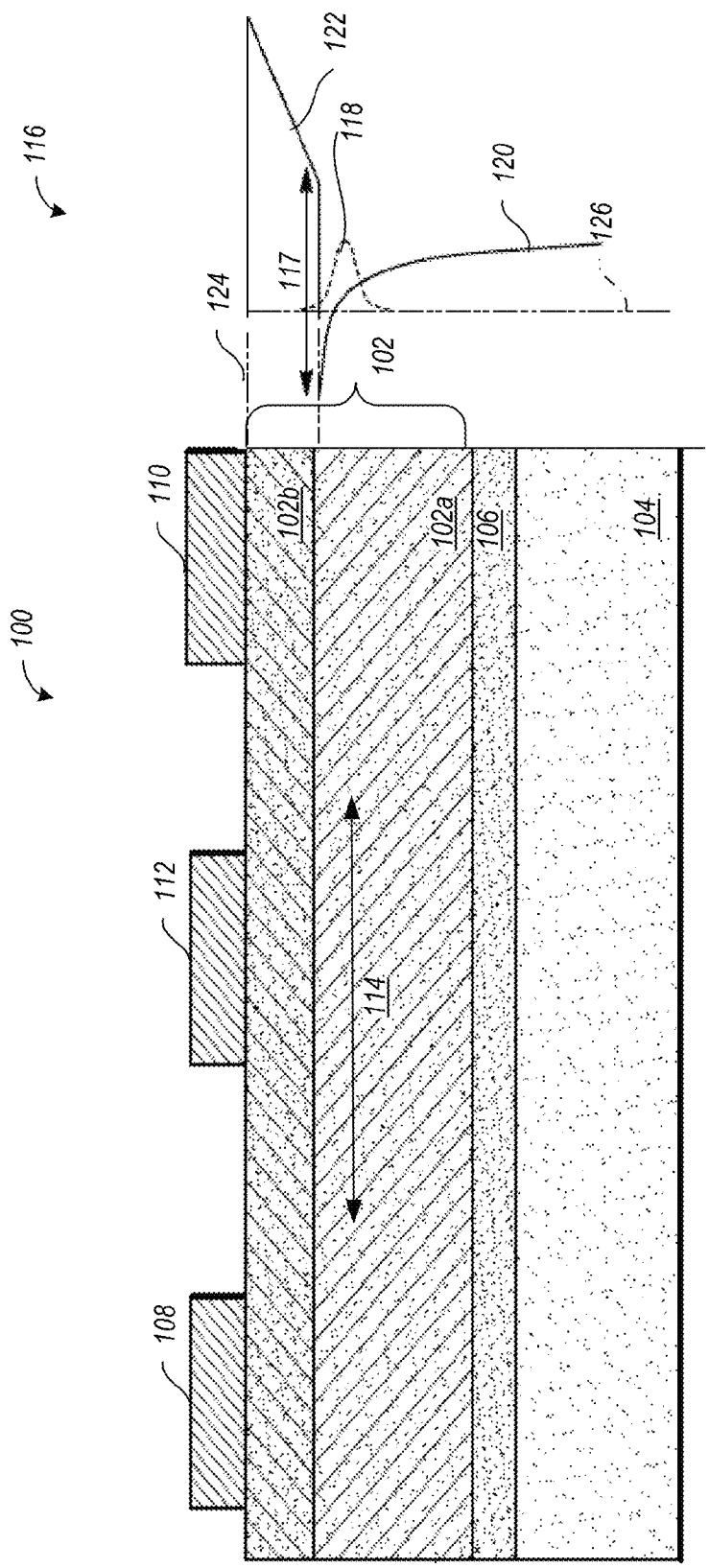
FIG. 1 is a side view of a conventional high electron mobility transistor (HEMT) device, including graphs of energy levels and electron concentrations associated with a generic heterostructure, according to the prior art.
Figure 2A:
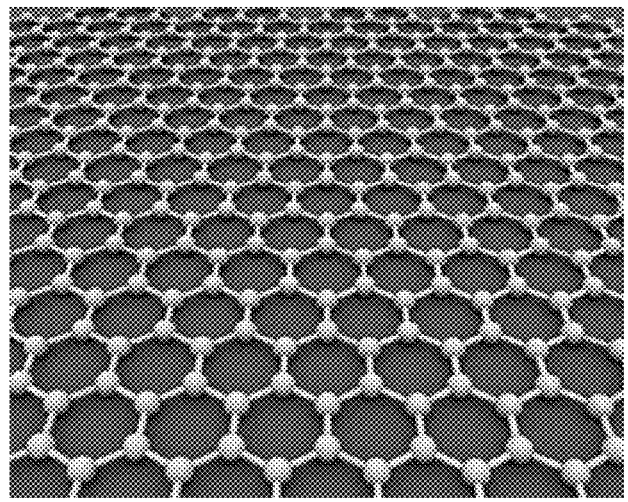
FIG. 2A is a pictorial view of a model of the molecular structure of a graphene crystalline sheet, according to the prior art.
Figure 2B:
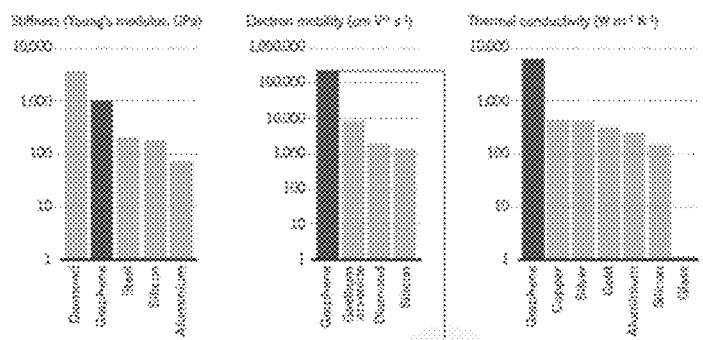
FIG. 2B shows a series of prior art bar graphs comparing mechanical, electrical, and thermal properties of graphene with those of other materials.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the terms "layer" is used in its broadest sense to include a thin film, a cap, or the like. The term "compound semiconductor" generally includes any semiconductor that has one or more materials outside column IV of the periodic table of the elements (e.g., carbon, silicon, germanium, etc.), or combinations of such materials. The term "high-frequency" in the context of operating wireless communication devices, is meant in a relative sense, and is not limited to a designated frequency range (e.g., a particular "HF band" within the range of 3-30 MHz).

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of HEMT devices that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

Figure 3:
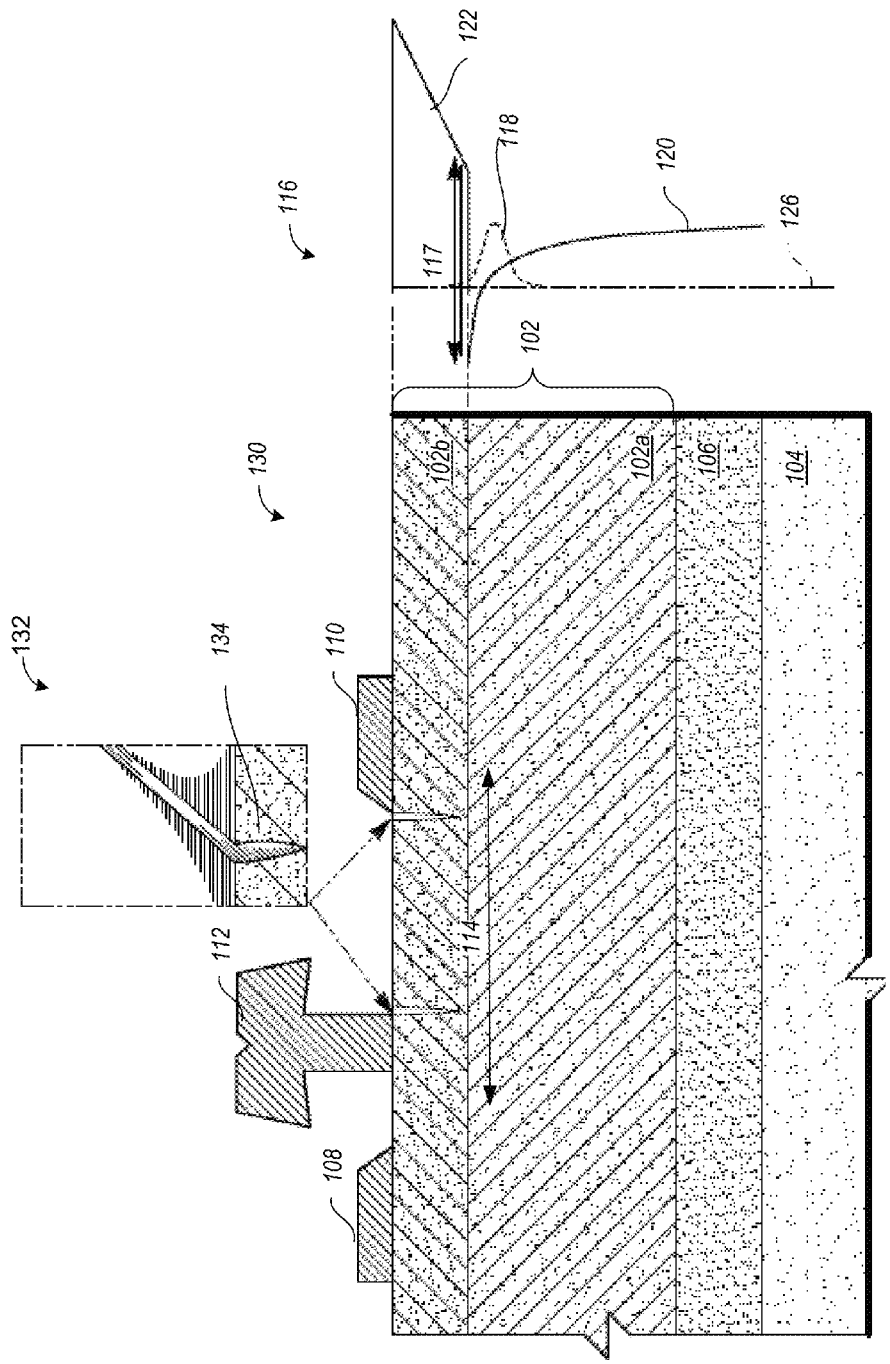
FIG. 3 is a cross-sectional view of a flawed AlGaN/GaN HEMT device that exhibits cracking under high-frequency operation, according to the prior art.

FIG. 3 is a cross-sectional view drawn from a scanning electron micrograph (SEM) image 132 of a state-of-the-art HEMT device 130 in which the heterostructure 102 has a top layer 102a made of aluminum gallium nitride ($Al_xGa_{(1-x)}N$) on a lower layer 102b made of gallium nitride (GaN). The substrate 104 is either aluminum oxide ($Al_2O_3$) or silicon carbide (SiC); the buffer layer 106 is GaN; and the T-shaped gate 112 is made of metal. The source and drain contacts 108 and 110, respectively, are metal ohmic contacts that use metals such as Ni, Ti, Pt, Au, Cu Al, W, or combinations thereof. Each of the films has a thickness that can be in the range of about 10 nm-10 μm. The channel width ranges from about 10 nm-10 μm, while the channel length ranges from about 3 nm-3 μm.

Several challenges have arisen in making and operating the HEMT device 130 in high-frequency, high-energy applications. First, as shown in FIG. 3, a drawing of a scanning electron micrograph 132, the AlGaN surface near the T-shaped gate 112 and near the source and drain contacts 108 and 110, is prone to develop cracks 134 under high-power operation. Failure analysis of such cracks 134 has shown that they tend to initiate at the corners of the metal areas, where the metal meets the AlGaN layer, and can extend through substantially the full thickness of the AlGaN layer. Such cracks 134 are theorized to be associated with observed gate current leakage. In addition to reliability concerns associated with the cracks 134, heat buildup and proper heat dissipation within the HEMT device 130 can also be as significant problem.

Figure 4:
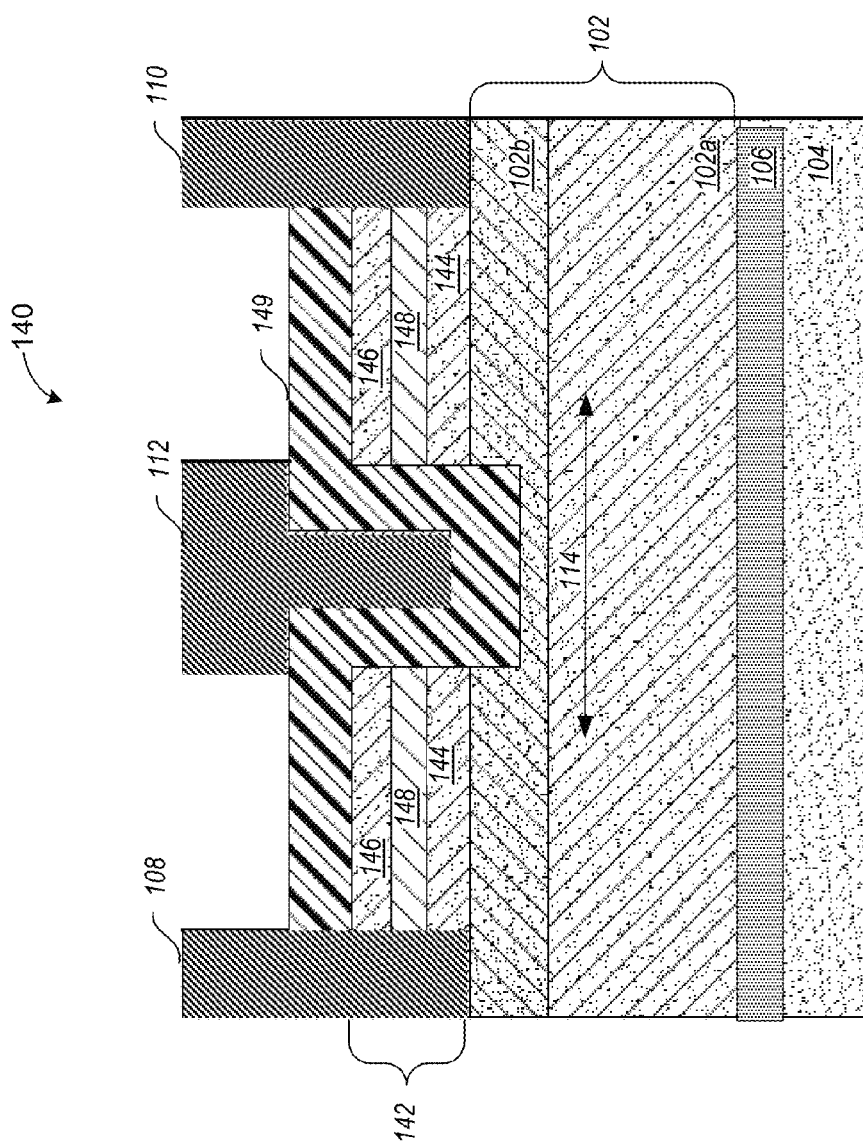
FIG. 4 is a cross section of a prior art AlGaN/GaN HEMT device that includes a multi-layer cap to reduce the cracks shown in FIG. 3, according to one embodiment.

FIG. 4 shows one embodiment of an improved, multi-layer cap HEMT device 140 that has been proposed to reduce gate current leakage and also greatly reduce the cracks 134 [Fujitsu press release Jun. 24, 2009, Kawasaki, Japa (http://www.fujitsu.com/global/news/pr/archives/month/2009/20090624-01.html)]. The multi-layer cap HEMT device 140 has features in common with the conventional HEMT device 130 in that it has a heterostructure 102 constructed on a substrate 104. In the multi-layer cap HEMT device 140, the heterostructure is made of an upper layer 102b made of AlGaN on a lower layer 102a made of GaN and the substrate 104 is made of SiC. A three-layer cap 142 is preferably present between the gate 112 and the source and drain contacts 108 and 110, respectively. The three-layer cap 142 includes a first layer 144 and a third layer 146, made of n-doped GaN. A middle layer 148 is made of AlN. Above the three-layer cap 142 there is deposited a gate dielectric made of an atomic layer of $SiO_2$ 149, which extends underneath the T-shaped gate 112, the gate dielectric being recessed into the top (AlGaN) layer 102a of the heterostructure 102.

The multi-layer cap HEMT device 140 has been successful in high-energy operation in that it has not exhibited the types or quantity of cracks 134 in FIG. 3. In addition, the multi-layer HEMT device 140 has shown an increase in the number of carrier electrons in the conduction channel 114. The use of SiC as the substrate material also helps to dissipate heat during high power operation. This embodiment therefore provides significant benefits over the prior art. Unfortunately, the three-layer cap 142, in this type of structure, may have a higher dielectric constant of the gate dielectric and a slower switching speed than desired. Furthermore, the user of SiC as the substrate material is very expensive, so it would be desirable to fabricate a reliable HEMT device on a silicon substrate.

Figure 5:
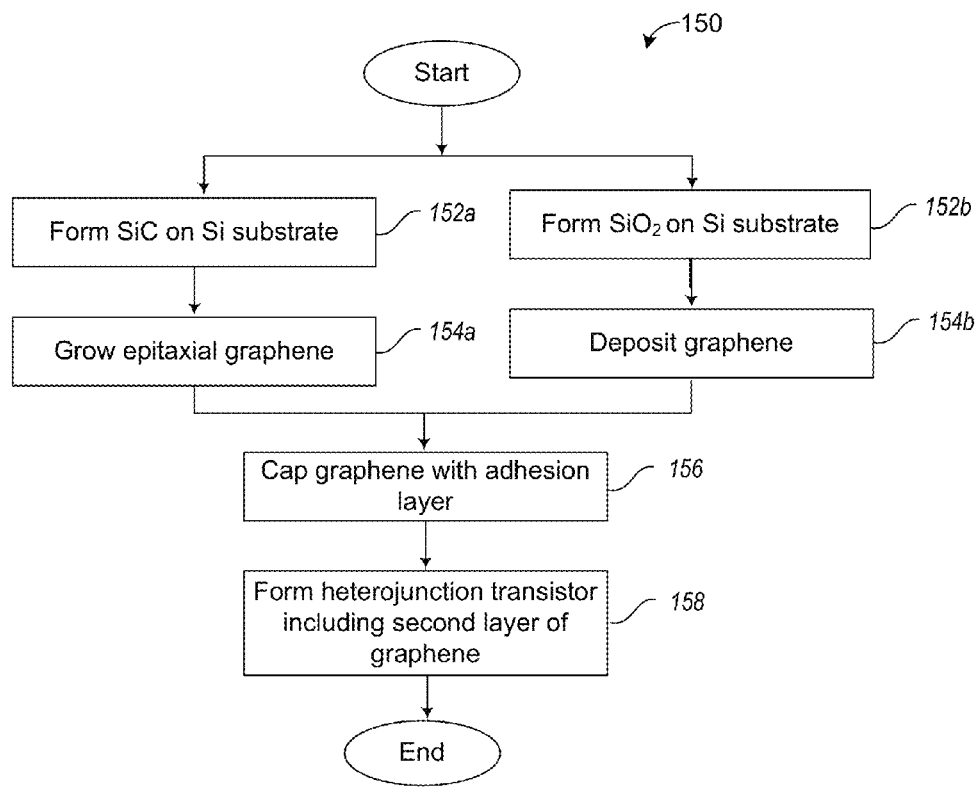
FIG. 5 is a high-level flow diagram summarizing a processing sequence for fabricating a graphene capped HEMT device as described herein, according to two alternative embodiments.

FIG. 5 shows a high-level flow of a fabrication process 150 for building a graphene capped HEMT 152 on a silicon substrate 104, according to two alternative embodiments described herein. The graphene capped HEMT employs two layers of graphene at different locations to maintain both structural integrity and improved device performance under high-frequency operation.

In a first embodiment, at 152a, the substrate 104, made of silicon in this embodiment, has a layer of SiC formed thereon.

At 154a, a first, epitaxial layer of graphene is then grown on the SiC.

Alternatively, in a second embodiment at 152b, the silicon substrate has a layer of $SiO_2$ formed thereon, and the graphene layer can be formed on the $SiO_2$ at 154b. The graphene layer can be formed on the layer of SiC or $SiO_2$ by any acceptable method, including deposition or growth in an amorphous form, a polycrystalline form, a single crystal form, or by epitaxial growth.

At 156, the graphene can be capped with an adhesion layer.

At 158, a heterojunction transistor is then formed that includes a second layer of graphene.

FIGS. 6-10 show in more detail some aspects of the fabrication process 150 for the graphene capped HEMT.

FIGS. 6A-6C describe and show a film stack 160 built on the Si substrate 104 that includes first and second graphene layers 161 and 162, respectively, and, optionally, an adhesion layer 164. The first graphene layer 161 is designed to absorb and dissipate heat generated by the transistor, and the second graphene layer 162 is designed to prevent gate current leakage without degrading the switching speed of the graphene capped HEMT. The second graphene layer 162 also serves to dissipate heat. The detailed process flow 166 shown in FIG. 6A describes processing steps that can be carried out to fabricate the film stack 160.

At 167, the buffer layer 106, made of $SiO_2$ in the embodiment shown, can be grown or deposited on the silicon substrate 104 using a conventional method such as, for example, thermal oxidation by heating the substrate 104 in a diffusion furnace. Alternatively, the buffer layer 106 can be made of SiC. The buffer layer 106 can have a thickness within the range of about 2 nm-100 nm.

At 168, the first graphene layer 161 is formed. It can be deposited using a conventional method such as, for example, chemical vapor deposition (CVD) at a low temperature. A monolayer film is desirable, although a multi-layer graphene film can also be used. Typically, thicknesses of graphene films are in the range of about 10 Å-20 nm. The first graphene layer 161, disposed between the heterostructure 102 and the substrate 104, serves as a heat sink to absorb energy from the HEMT, and then spread out over a wider area to dissipate the heat, especially when the HEMT is operated in a high-frequency, high-energy mode.

At 170, an optional adhesion layer 164 can be deposited on the first graphene layer 161 to facilitate subsequent deposition of the GaN lower layer of the heterostructure 102. It is understood to persons skilled in the art of thin film fabrication that it is difficult to deposit nitride semiconductors directly onto graphene. Thus, a thin adhesion layer is recommended.

A desirable material for use as the adhesion layer 164 is hexagonal boron nitride (h-BN), a nitride semiconductor which has been shown to promote high-quality film growth of nitride semiconductors [Kobayashi et al., *Nature*, Vol. 484, April, 2012, p. 223-227]. Because h-BN has a hexagonal lattice structure 165 that closely matches the lattice structure of the underlying graphene film, a thin layer of single crystal h-BN can be easily formed on the graphene and can provide relief of film stress. The hexagonal lattice structure 165 of the h-BN adhesion layer 164 is shown in FIG. 6C. The h-BN lattice is made up of hexagonal rings, each containing three boron atoms and three nitrogen atoms. H—BN is widely used in consumer products as an alternative lubricant to carbon graphite, and in high temperature equipment, for example, due to its thermal and chemical stability. H—BN is also combined with various materials to enhance their thermal, chemical, and electrical properties. Additionally or alternatively, a different adhesion layer material, for example, ZnO can be used between the GaN film and the graphene.

The steps 172, 174 entail sequential deposition of two semiconductor layers, typically compound semiconductors, to form the heterostructure 102 having a lower layer 102a, an upper layer 102b and, between them, a heterojunction that exhibits energy characteristics similar to those shown in FIGS. 1 and 3 (see plots 116).

At 172, a lower layer 102a of un-doped GaN can be grown using an epitaxial deposition method such as, for example, metal-organic vapor phase epitaxy (MOVPE). Additionally, an AlN or AlGaN buffer can be grown on the h-BN surface prior to deposition of the GaN film [Kobayashi et al., *Nature*, Vol. 484, April, 2012, p. 223-227].

At 174, an upper layer 102b of n-doped AlGaN can be grown on the GaN film. Growth of the GaN and AlGaN films can use conventional methods known in the art of HEMT device processing. Alternatively, other intrinsic semiconductor compounds, alone or combined with or other compound semiconductor materials, can be substituted in the AlGaN/GaN heterostructure 102 such as, for example, AlN, GaAs, AlGaAs, InGaN, InP, InGaP, InN, InAlAs, InGaAs, AlGaSb, AlSb, InAs and the like.

At 176, the second graphene layer 162 is formed overlying the upper layer 102b. The second graphene layer 162 may also be considered a graphene cap, or a graphene cap layer, since it is a layer that is a cap over the top compound semiconductor layer 102b. The complete film stack is shown in FIG. 6B.

FIGS. 7A-7D describe and show a detailed process sequence 180 for fabricating the HEMT transistor.

Figure 7B:
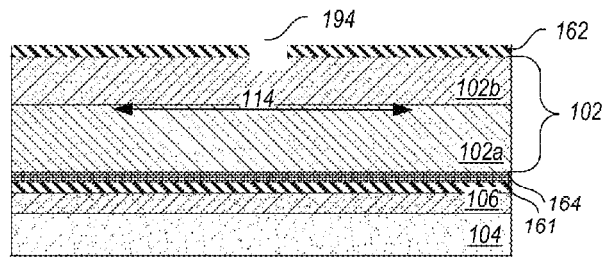
FIGS. 7B-7D are cross-sectional views illustrating fabrication of the transistor graphene-capped HEMT in accordance with the exemplary process flow shown in FIG. 7A.
Figure 7A:
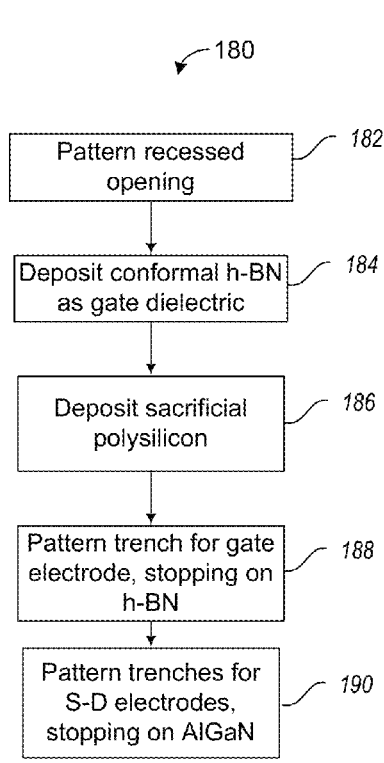
FIG. 7A is a process flow diagram showing a sequence of process steps that can be used to fabricate a graphene-capped HEMT as described herein, according to an exemplary embodiment.

At 182, a recessed opening 194 is made in the second graphene layer 162, and the recessed opening extends into the underlying AlGaN layer. The recessed opening 194 can be formed using conventional patterning methods such as optical lithography and either dry plasma etching or wet chemical etching, or combinations thereof (FIG. 7B).

At 184, a thin h-BN film 196 can be conformally deposited as a high-k gate dielectric material. H—BN is known in the art as an "outstanding gate dielectric material for GFETs, yielding interfaces nearly free of trapped charge and maintaining high mobility and carrier velocities in the graphene channel" [Meric, et al., *Proceedings of the IEEE IEDM Conference*, Dec. 5-7, 2011, pp. 2.1.1-2.1.4]. In the present case, h-BN serves as a gate dielectric in the HEMT. It is noted that in the present HEMT device, graphene is not used as a channel replacement material as described by Meric et al. with respect to the GFET device. The conduction channel 114 in the graphene-capped HEMT presented herein is located at the heterojunction, which is separate from the h-BN film and the graphene cap layers.

Figure 7C:
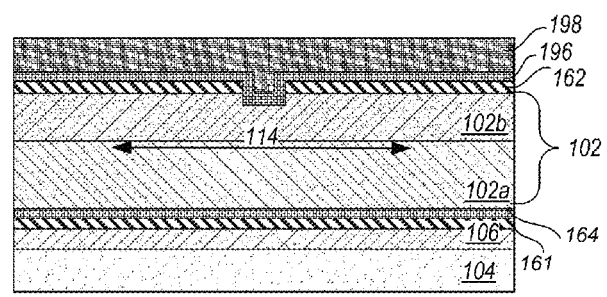

At 186, a sacrificial film 198 can be deposited over the h-BN film 196. The sacrificial film 198 can be made of, for example, polysilicon. The thickness of the sacrificial film 198 is nominally about 100 nm, but generally scales with the size of the electrodes, e.g., within the range of about 50 nm-450 nm (FIG. 7C).

At 188-190, the sacrificial film 198 can be patterned using conventional lithography and etching techniques for a damascene inlay process. Accordingly, trenches can be created in the sacrificial film 198 for subsequent formation of the metal gate electrode, and the metal source and drain electrodes.

At 188, the sacrificial film 198 can be masked using, for example, a photoresist mask or a silicon nitride hard mask, so as to expose only the desired gate area. The sacrificial film 198 can then be etched selective to the h-BN film 196 to form a gate trench 200 that extends to the surface of the h-BN film 196.

Figure 7D:
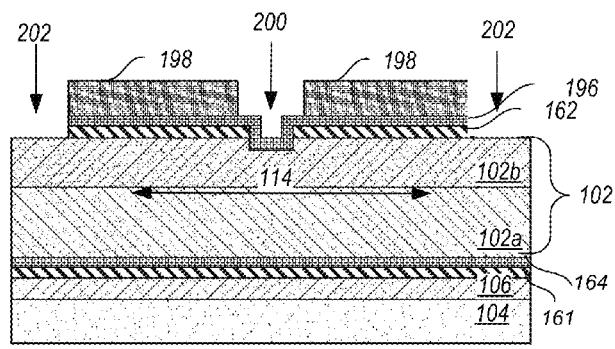

At 190, the sacrificial film 198 can be masked using, for example, a photoresist mask or a silicon nitride hard mask, so as to expose only the desired source and drain regions. The sacrificial film 198 can then be etched selective to the AlGaN film to form source and drain trenches 202 that extend to the surface of the heterostructure 102 (FIG. 7D).

Figure 8B:
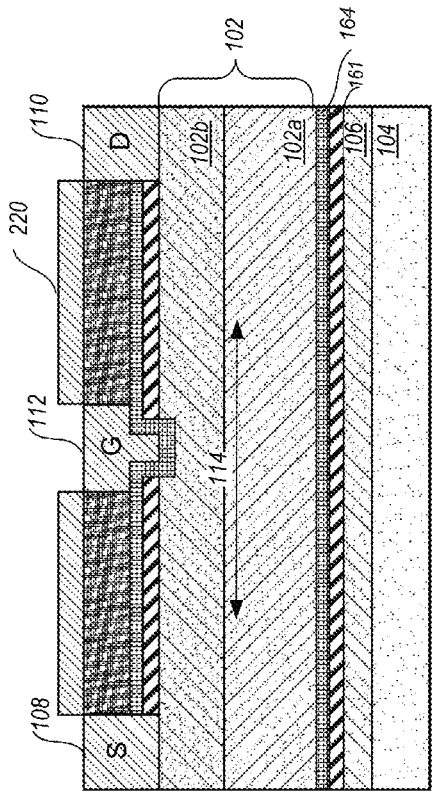
FIGS. 8B-8C are cross-sectional views illustrating fabrication of the metal source, drain, and gate contacts of a graphene-capped HEMT device in accordance with the exemplary process flow shown in FIG. 8A.
Figure 8C:
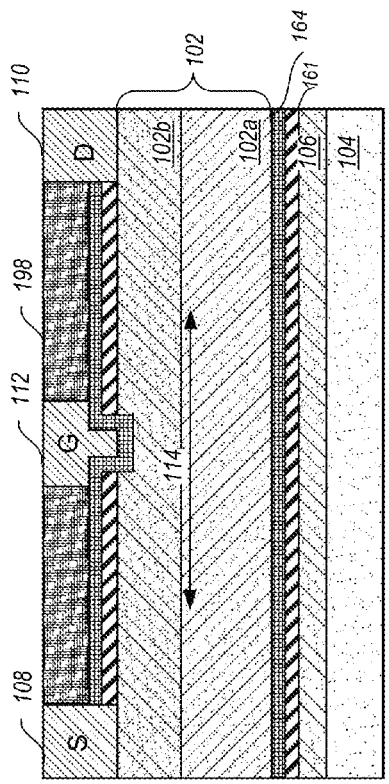
Figure 8A:
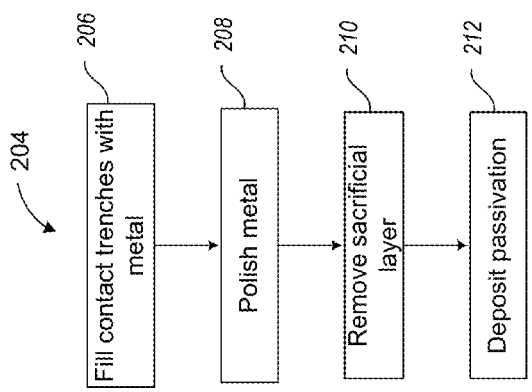
FIG. 8A is a process flow diagram showing a sequence of process steps that can be used to form metal source, drain, and gate contacts of a graphene-capped HEMT device as described herein, according to an exemplary embodiment.
Figure 9:
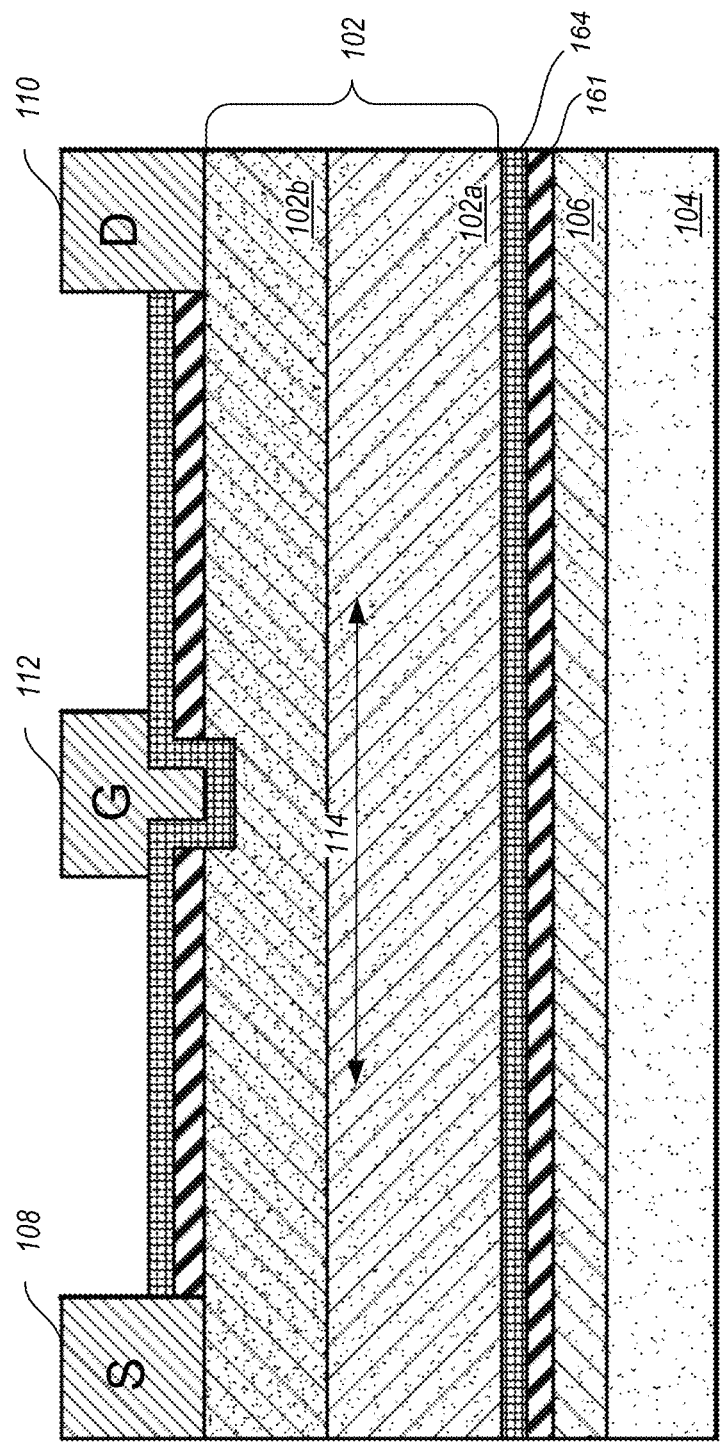
FIG. 9 is a cross-sectional view of a completed graphene-capped HEMT device as described herein, according to an exemplary embodiment.

FIGS. 8A-8C describe and show a detailed process sequence 204 for fabricating metal terminals of the HEMT device, shown in its completed form in FIG. 9.

At 206, the source, drain, and gate trenches 202 and 200, respectively, can be filled with a desired bulk metal 220 such as, for example, Ni, Ti, Pt, Al, Cu, Ag, Au, or W (FIG. 8B). The thickness of the bulk metal 220 is desirably about 50 nm. Prior to depositing the desired bulk metal 220, a liner material such as, for example, titanium, titanium nitride (TiN) or a sandwich thereof may be deposited. The liner can be used in any or all of the source, drain, and gate contacts, and is desirably very thin, in the range of about 1-8 nm. The trench fill processing step can be carried out by, for example, electroplating, electro-less plating, or other damascene techniques known in the art. If a liner is used, the liner deposition may be combined with the bulk metal fill to create a two-step metal fill process, or the liner may be grown or deposited conformally by another method (e.g., by a plasma deposition step).

At 208, a planarization process is executed, such as chemical-mechanical planarization (CMP) using a slurry suitable for planarizing the surface of the bulk metal 220 (FIG. 8C), and stopping on the sacrificial film 198. A more precise alternative to CMP polishing that is suitable for gold films, for example, is a smoothing process that involves use of a gas cluster ion beam (GCIB).

At 210, the sacrificial film 198 remaining between the source and the gate, and the gate and the drain, can be removed (FIG. 9). Consistent with the embodiment shown, removal of the sacrificial film 198 can be done using a conventional polysilicon reactive ion etch (RIE) chemistry that is selective to both metal and h-BN.

At 212, a conventional passivation layer such as oxy-nitride or silicon nitride (SiN) can be applied to protect the HEMT device from environmental effects, e.g., moisture.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high electron mobility transistor (HEMT), comprising:
   a substrate;
   a heterostructure formed by top and bottom compound semiconductor layers sequentially deposited over the substrate;
   a first graphene layer formed below the bottom compound semiconductor layer;
   a second graphene layer formed above the top compound semiconductor layer;
   source and drain contacts electrically coupled to the top compound semiconductor layer; and
   a metal gate that modifies energy bands within the heterostructure in response to a voltage applied to the gate.

2. The HEMT of claim 1, further comprising one or more adhesion layers in contact with the first or second graphene layers.

3. The HEMT of claim 2 wherein one or more of the adhesion layers includes hexagonal boron nitride.

4. The HEMT of claim 2 wherein one of the adhesion layers serves as a gate dielectric.

5. The HEMT of claim 1 wherein the substrate includes silicon covered with silicon dioxide.

6. The HEMT of claim 1 wherein the substrate includes silicon covered with silicon carbide.

7. The HEMT of claim 1 wherein the heterostructure includes one or more of GaN, AN, InP, AlGaN, GaAs, AlGaAs, InGaN, InGaP, InAlAs, InGaAs, AlGaSb, AlSb, or InAs.

8. The HEMT of claim 1 wherein the metal gate includes one or more of Ni, Ti, Pt, Al, Au, Cu, Ag, W, or combinations thereof.

9. The HEMT of claim 1 wherein the metal gate includes a liner material made of titanium or titanium nitride (TiN).

10. The HEMT of claim 1 wherein a switching speed of the HEMT exceeds 200 GHz.

* * * * *

UNITED STATES PATENT AND TRADEMARK OFFICE
CERTIFICATE OF CORRECTION

| | | |
|---|---|---|
| PATENT NO. | : 8,987,780 B2 | Page 1 of 1 |
| APPLICATION NO. | : 13/907752 | |
| DATED | : March 24, 2015 | |
| INVENTOR(S) | : John H. Zhang et al. | |

It is certified that error appears in the above-identified patent and that said Letters Patent is hereby corrected as shown below:

Title Page

Item (71):
"STMicroelctronics, Inc., Coppell, TX (US)" should read, --STMicroelectronics, Inc., Coppell, TX (US)--.

Signed and Sealed this
Twentieth Day of October, 2015

Michelle K. Lee
*Director of the United States Patent and Trademark Office*